United States Patent [19]

Hallford

[11] 4,371,982
[45] Feb. 1, 1983

[54] MICROWAVE FREQUENCY CONVERTER WITH ECONOMICAL COUPLING

[75] Inventor: Ben R. Hallford, Wylie, Tex.

[73] Assignee: Rockwell International Corporation, El Segundo, Calif.

[21] Appl. No.: 243,231

[22] Filed: Mar. 13, 1981

[51] Int. Cl.$^3$ ............................................. H04B 1/26
[52] U.S. Cl. ..................................... 455/327; 455/330
[58] Field of Search ............. 455/325, 326, 327, 330, 455/331; 330/4.9; 307/424; 333/26; 332/43 B, 44, 47, 52

[56] References Cited

U.S. PATENT DOCUMENTS

| | | |
|---|---|---|
| 2,834,876 | 5/1958 | Pritchard et al. |
| 3,652,941 | 3/1972 | Neuf |
| 3,678,433 | 7/1972 | Hallford |
| 3,681,697 | 8/1972 | Moroney |
| 3,772,599 | 11/1973 | Ernst et al. |
| 3,831,097 | 8/1974 | Neuf |
| 4,240,052 | 12/1980 | Hallford et al. |

OTHER PUBLICATIONS

Julius Lange, "Interdigitated Strip-Line Quadrature Hybrid", 1969 *International Microwave Symposium*, Dallas, Texas, May 5-7, IEEE Cat. No. 69 c 6, pp. 10-13.
Ben R. Hallford, "Trace Phase States to Check Mixer Designs", *Microwaves*, Jun. 1980, pp. 52-60.
L. E. Dickens and D. W. Maki, "A New 'Phase-Typed' Image Enhanced Mixer", 1975 *IEEE MTT Symposium*, pp. 149-151.
George L. Matthaei, et al., "Microwave Filters, Impedance-Matching Networks, and Coupling Structures", New York, McGraw-Hill, 1964, pp. 809-812.

*Primary Examiner*—Marc E. Bookbinder
*Attorney, Agent, or Firm*—Michael E. Taken; Bruce C. Lutz; Howard R. Greenberg

[57] ABSTRACT

A microwave frequency converter is provided with cost effectively manufacturable microstrip layout circuitry, particularly for directionally coupling the LO signal. A pair of unbalanced microstrip conductors lead from a mixer bridge respectively to a pair of balun IF rejection filters juxtaposed on the opposite side of a dielectric substrate. A second pair of unbalanced microstrip conductors lead respectively from the pair of balun IF rejection filters to a microstrip branch line coupler.

14 Claims, 6 Drawing Figures

MICROWAVE FREQUENCY CONVERTER WITH ECONOMICAL COUPLING

TECHNICAL FIELD

The invention relates to microwave diode mixers and associated circuitry for up and down conversion between high frequency signals (e.g., RF or LO in the 6 GHz range) and low frequency signals (e.g., IF in the 70 MHz range), and more particularly to a cost effective integrated microstrip coupling combination therefore.

BACKGROUND AND SUMMARY

The present invention evolved from continuing development efforts pertaining to subject matter disclosed in my application Ser. No. 216,872, filed Dec. 15, 1980, and now issued as U.S. Pat. No. 4,330,868. This referenced patent discloses coupling circuitry for the LO signal utilizing a Lange-type 90° quadrature hybrid 3 dB coupler comprised of a plurality of interdigitated striplines, for example as described in "Interdigitated Strip-Line Quadrature Hybrid", Julius Lange, 1969 *International Microwave Symposium*, Dallas, Tex., May 5-7, IEEE Cat. No. 69 c 6, pp. 10-13.

The present invention relates to improvements in the coupling circuitry combination providing significant cost reduction. The invention provides a microstrip circuit layout combination which affords the desired coupling and eliminates the Lange-type interdigitated coupler which is more costly to implement. The invention further relates to additional improvements in microstrip circuit layout to further improve the cost effectiveness of the overall circuit.

DETAILED DESCRIPTION OF BACKGROUND AND OF RELATED SUBJECT MATTER

This section is included to facilitate understanding and appreciation of the invention described in the succeeding section.

Microwave diode mixers are well known in the art. In a down converter, the mixer has an input port for receiving an RF signal and an input port for receiving a local oscillator (LO) signal. The mixer has an output port delivering a plurality of frequencies, including an IF signal at a frequency which is the difference between the RF and LO signal frequencies. The frequencies which are output from the mixer are the modulation products which exist according to the heterodyne principle by which the mixer operates, wherein an RF signal and an LO signal are applied to a nonlinear element such as a diode.

In an up converter, the mixer has an input port for receiving an LO signal and an input port for receiving an IF signal. The mixer has an output port for delivering a plurality of frequencies, including RF signals which are the sum and difference of the LO and IF signal frequencies. The frequencies which are output from an up converter mixer are likewise the modulation products which exist according to the heterodyne principle by which the mixer operates.

A double balanced diode mixer has two pairs of diodes either cross connected (lattice modulator) or connected in a loop (ring modulator), which are equivalent. The individual diodes in each pair are commonly poled, and the composite pairs may be commonly or oppositely poled.

In addition to the IF signal, a down converter mixer generates a signal which is the image of the RF signal but on the opposite frequency side of the LO signal. As an example, a mixer receiving a 6 GHz (6,000 MHz) input RF signal and a 5,930 MHz input LO signal would generate a 70 MHz IF signal and a 5,860 MHz image RF signal. About half of the incoming RF power is used in generating this image frequency signal. The loss in converting an incoming RF signal to an IF signal is thus significantly increased by this image frequency generation. Likewise for up conversion, conversion loss is caused by frequency generation of an unused sideband. For further background regarding mixer operation, reference is made to my article entitled "Trace Phase States to Check Mixer Designs", *Microwaves*, June, 1980, pages 52-60.

Prior art devices have eliminated the image frequency signal in a variety of ways. Some devices use filters to prevent the image frequency signal from entering the input signal circuitry, but this still results in an energy loss to the system, and also reduced bandwidth. Some devices provide an open or short circuit at the diodes in order to recover, or reduce the loss of, the image frequency energy. U.S. Pat. Nos. 2,834,876 and 3,681,697 show image recovery mixers where the image frequency power is reflected back to the mixer to provide recovery of the image frequency energy. These devices are discussed in U.S. Pat. No. 3,831,097 to Neuf, which shows an image recovery mixer system having two double balanced mixers each of the diode bridge type, one set of opposing diagonals of one bridge being interconnected with one set of opposing diagonals of the other bridge to cancel the image frequency signal directly between the diode mixers.

Another patent to Neuf, U.S. Pat. No. 3,652,941, shows a mixer with a single diode-quad bridge. Each side of the bridge is input from balanced lines referenced to each other, i.e., balanced circuits that do not have a ground reference at the diode terminals, are used for both the RF and LO inputs to the mixer. One RF line is on top of a dielectric substrate and the other RF line is on the bottom. The balanced LO lines are likewise juxtaposed on opposite sides of the substrate.

Other mixer circuits with a single diode-quad mixer bridge are shown in a paper entitled "A New 'Phase-Typed' Image Enhanced Mixer", by L. E. Dickens and D. W. Maki, 1975 *IEEE MTT Symposium*, pp. 149-151, and in Ernst et al., U.S. Pat. No. 3,772,599. The mixer is formed by two pairs of diodes providing a bridge across a slot transmission line. While these mixers have proved useful for their intended purpose, they suffer the inherent disadvantages and undesirable characteristics of slot line circuits, including the various constraints on the dimensions of the slot, minimum ground plane spacing on either side of the slot, the requisite high dielectric constant substrate, transmission mode waveguide problems, etc. The width of the slot should usually be no greater than 5 to 10 mils. A dielectric substrate having a high magnitude of relative dielectric constant of 9 to 10 or greater is needed. If the slot line is to be generally useful as a transmission line, the fields must be closely confined to the slot. Close confinement can be achieved with slots of realistic dimensions by using a fairly high dielectric constant substrate. If the guide wavelength is roughly 30 to 40 percent of the free space wavelength, the fields will be adequately confined. Low dielectric constant substrates, for example less than about 8, are typically not suitable for slot line application because the energy is not well confined to the slot. A further drawback is that specialized and expensive fabrication techniques are required, such as a thin film operation depositing gold on ceramic.

Figure 1:
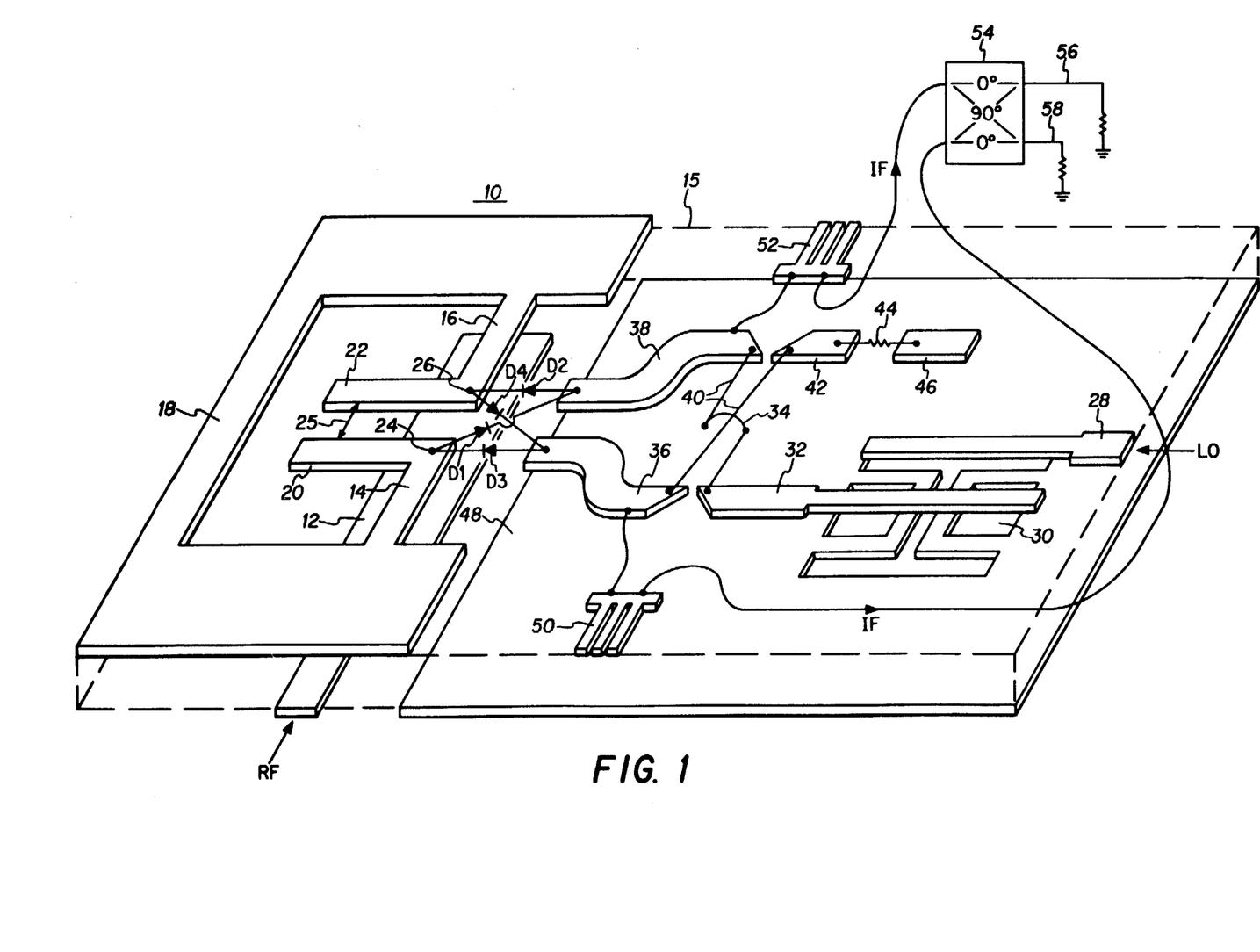
FIG. 1 is a pictorial illustration of the microstrip circuit layout disclosed in my above-noted Application Ser. No. 216,872, now U.S. Pat. No. 4,330,868 and is included to facilitate understanding of the present invention.

FIG. 1 shows the balun coupled microwave frequency converter 10 disclosed in my previously referenced U.S. Pat. No. 4,330,868. For down conversion, transmission path 12 receives an RF signal and couples it to conductors 14 and 16 from which transmission path 12 is spaced by a dielectric material substrate 15. This substrate may have a relative dielectric constant as low as about 2 to 5. Conductors 14 and 16 are connected to a U-shaped ground plane 18. Conductors 14 and 16 extend inwardly from the ground plane towards each other and each have a length of one-quarter of the wavelength of the RF frequency. A pair of stubs 20 and 22 extend parallel to each other and perpendicular from and integral with a respective one of the conductors 14 and 16. Stubs 20 and 22 have a length of one-quarter wavelength of the RF frequency and are not connected at their ends to ground plane 18, but rather are open-circuited.

Conductor 14 and stub 20 meet at junction point 24, and conductor 16 and stub 22 meet at junction point 26. The field coupled from transmission path 12 is created across the gap 25 between balanced junction points 24 and 26. The width of gap 25 may be up to 40 mils. First and second RF conductors 14 and 16 thus extend from the ground plane toward a common area. Input RF signal transmission line 12 is juxtaposed conductors 14 and 16 for interacting therewith to generate a field across the common area and provide the balun couple.

Transmission path 28 receives the local oscillator (LO) or carrier frequency signal. The LO signal on transmission path 28 is coupled through a bandpass filter or signal isolator 30 to a conductor 32. Filter 30 passes signals in the LO frequency range from transmission path 28 to conductor 32. In the reverse direction, filter 30 blocks signals in the IF frequency range from being transmitted from conductor 32 to transmission path 28 and thus provides IF isolation. This filter is shown in my U.S. Pat. No. 4,240,052, issued Dec. 16, 1980, entitled "Balun Filter Apparatus", and presents high isolation impedance to IF and hence an effective open-circuit to IF.

The LO signal on conductor 32 is coupled through a 90 degree quadrature hybrid 3 dB coupler 34 to conductors 36 and 38 such that the LO signals appearing on these conductors are 90 degrees out of phase with each other. These types of hybrid couplers are known in the art, for example as shown in said U.S. Pat. No. 3,831,097, Neuf. Hybrid coupler 34 includes a plurality of interdigitated strip lines 40, for example as described in "Interdigitated Strip-Line Quadrature Hybrid", Julius Lange, 1969 *International Microwave Symposium*, Dallas, Tex., May 5–7, IEEE Cat. No. 69 c 6, pp. 10–13. A conductor 42 is provided with a resistor 44 to an open circuited stub 46 which has a length of one-quarter wavelength of the RF frequency. This arrangement provides an impedance match for RF signals, and provides a substantially infinite impedance to IF signals to appear as an open-circuit to the latter.

Conductor 36 is unbalanced, with the field therearound being coupled to ground plane 48, which is spaced from conductor 36 by the dielectric substrate 15. Conductor 38 is likewise unbalanced, with a ground reference to ground plane 48.

In FIG. 1, conductor 12 and ground plane 48 are coplanar and are on the bottom-side of substrate 15. Conductors 28, 32, 36, 38, 42, 46, 14, 20, 16, 22 and ground plane 18 are all coplanar and are on the top-side of substrate 15. In an alternative embodiment, conductor 12 is on the top-side of substrate 15; and conductors 14, 20, 16 and 22 are on the bottom-side of substrate 15, with ground plane 18 also on the bottom-side of substrate 15 and continuous with ground plane 48.

A diode bridge is formed by four diodes D1, D2, D3 and D4, and is connected between RF conductor points 24 and 26 and LO conductors 36 and 38. The LO and RF signals are mixed in the diodes to generate the various modulated frequencies, including an IF signal on conductors 36 and 38. A pair of IF bandpass filters 50 and 52 are on the top-side of substrate 15 and are connected to the conductors 36 and 38. These filters are connected to a 90 degree quadrature hybrid 3 dB coupler 54 having a pair of outputs 56 and 58 for the upper and lower sidebands. Filters 50 and 52 are RF suppression filters rejecting RF signals but allowing IF signals to pass therethrough, an example of which is described in my U.S. Pat. No. 3,678,433. Hybrid coupler 54 may be like that shown in said U.S. Pat. No. 3,831,097, Neuf.

Figure 2:
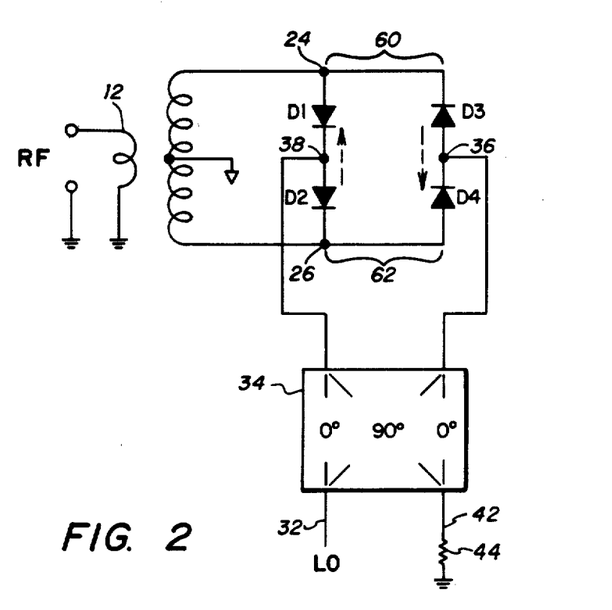
FIG. 2 is a circuit diagram of the converter of FIG. 1.

FIG. 2 shows the equivalent circuit. While FIG. 1 shows the diode-quad in a cross-connected configuration, FIG. 2 shows the diode-quad in a ring configuration to facilitate clarity in the following description. The configurations are electrically equivalent.

Referring to FIG. 2, the generated image frequency is shown by the dashed arrows. The image frequency phase is equal in diodes D1 and D2 so that they combine for this diode pair. The image frequency phase is equal in diodes D3 and D4 so that they combine for this diode pair. The summed image frequency in diode pair D1, D2 is 180 degrees out of phase with the summed image frequency in diode pair D3, D4. This gives a net zero voltage for the generated image frequencies. The image frequency power is therefore returned to the diodes to reduce the conversion loss.

Diodes D1 and D3 are connected to single common junction point 24, and hence the length of connection 60, FIG. 2, is zero. Likewise, diodes D4 and D2 are connected to the same junction point 26, and hence the length of connection 62 is zero. These zero connection lengths are important because they provide precise 180 degree phase differentials between the image frequency phase in diode pair D1, D2 and the image frequency phase in diode pair D3, D4.

As seen in FIG. 2, the image frequency current circulates in the diode-quad. If the connection lengths 60 and 62 are not zero, then the traversal distance for the image current would cause a phase shift. The image frequency phase in diode pair D1, D2 would be other than 180 degrees out of phase with the image frequency phase in diode pair D3, D4. This would reduce the conversion efficiency because of uncancelled image frequency power. The net voltage of the recovered image frequencies would not be zero because of the non-180 degree phase differential.

The connection length 60 is zero because of the single connection point 24, and the connection length 62 is zero because of the single connection point 26. The image frequencies in the diodes pairs are thus 180 degrees out of phase, giving a net voltage of zero for the generated image frequencies, whereby to reduce the conversion loss.

The circuit layout of FIG. 1 provides mutual isolation between the RF, LO and IF signals. The LO signal on conductor 38 is isolated from conductor 36 because of the low impedance, effective ground provided by junction point 26 due to one-quarter wavelength open stub 22, and because of the low impedance, effective ground provided by junction point 24 due to one-quarter wavelength open stub 20. One LO signal path from conductor 38 to conductor 36 is through diodes D2 and D4; however, the junction point therebetween is the effective ground point 26 and hence the LO signal may flow from conductor 38 through diode D2 but is isolated from conductor 36. The other LO signal path from conductor 38 to conductor 36 is through diodes D1 and D3; however, the junction point therebetween is the effective ground point 24 and hence the LO signal may flow from conductor 38 through diode D1 but is isolated from conductor 36. Likewise, the LO signal on conductor 36 is isolated from conductor 38 because of the low impedance, effective ground points 24 and 26.

The RF signal on balanced junction points 24 and 26 due to the induced field therebetween is isolated from conductors 36 and 38. The RF signal from junction point 24 flows through diode D1 and then diode D2 to junction point 26. Since RF conductor points 24 and 26 are balanced, they are each other's reference points, and hence the voltage on junction point 24 is referenced to junction point 26, not to ground as is the voltage on unbalanced conductor 38. The RF signal from junction point 24 flows through diode D1 toward conductor 38 and through diode D2 away from conductor 38 such that conductor 38 sees opposite polarities (voltages which are 180 degrees out of phase), and hence no net voltage is induced on conductor 38. The RF signal between junction points 24 and 26 is likewise isolated from conductor 36.

The LO signals on conductors 36 and 38 are isolated from the RF signal between RF conductor points 24 and 26. The LO signal on conductor 38 sees a low impedance, effective ground at each of points 24 and 26, whereby to add the same effective voltage to each in parallel, resulting in no change of the net voltage difference between points 24 and 26. The LO signal on conductor 36 is likewise isolated from the RF signal between points 24 and 26.

Figure 3:
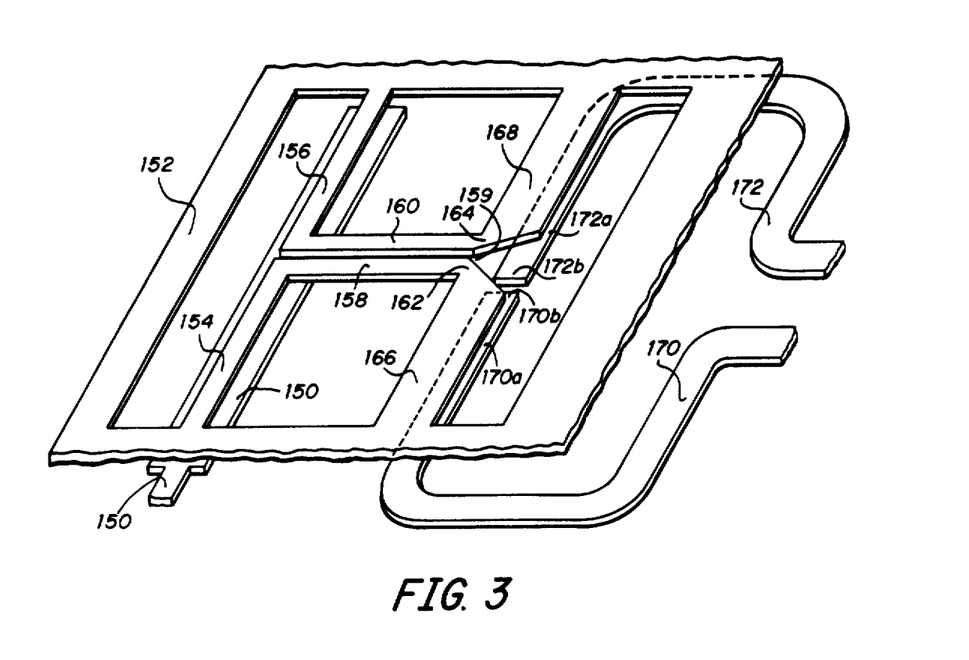
FIG. 3 is a pictorial illustration of an alternate embodiment of a portion of the microstrip circuit of FIG. 1.

FIG. 3 shows an alternative RF conductor microstrip pattern. RF transmission line 150, which corresponds to transmission line 12 of FIG. 1, couples the RF signal to coplanar RF conductors 154 and 156, corresponding to conductors 14 and 16 of FIG. 1. RF transmission line 150 extends beneath ground plane 152 to couple the RF signal to balanced, coplanar RF conductors 154 and 156 and is spaced therefrom by a dielectric material substrate (not shown). RF conductors 154 and 156 extend from ground plane 152 towards a common area and have extensions 158 and 160. The induced field between balanced conductors 154 and 156 exists across the common gap area therebetween along extensions 158 and 160 to points 162 and 164. The width of gap 159 is about 40 mils. RF conductor point 162 has a wide stub 166 tapered at its root end and extending to the ground plane 152. RF conductor point 164 has a wide stub 168 tapered at its root end and extending to the ground plane 152.

Figure 4:
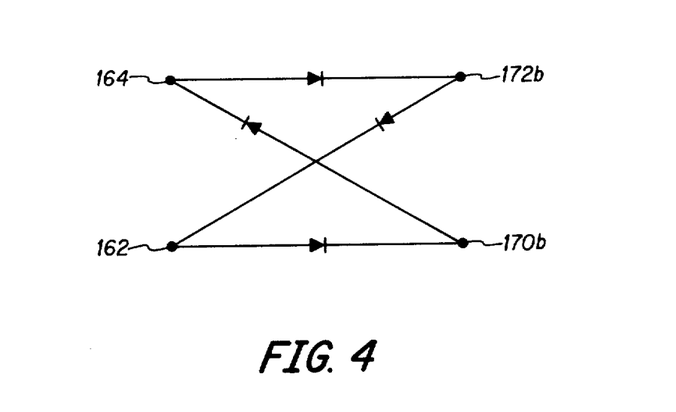
FIG. 4 shows the diode bridge connection for FIG. 3.

Unbalanced, coplanar LO conductors 170 and 172 have portions 170a and 172a spaced beneath ground plane 152 by the dielectric substrate (not shown) and extending toward the common area adjacent RF conductor points 162 and 164. The ends of LO conductor portions 170a and 172a are spaced and have diode connection points 170b and 172b for diode interconnection with RF conductor points 162 and 164, as shown in FIG. 4. RF conductors 158 and 160 are on the top side of the substrate, and LO conductors 170a and 172a are on the bottom side of the substrate, whereby the RF conductors are not coplanar with the LO conductors as in FIG. 1. In FIG. 3, ohmic leads extend from points 162 and 164 down through the substrate, and the diode bridge is connected on the bottom side of the substrate.

In FIG. 3, as in FIG. 1, the RF input to the bridge is balanced and the LO input is unbalanced. Image current circulates in the diode quad only, to return the image frequency power to the diodes. RF conductor points 164 and 162 provide single common zero connection length points for the diode pairs, to thus provide a precise 180° phase differential therebetween for generated image frequency, and a net image voltage of zero, thus reducing conversion loss. Wide stubs 166 and 168 appear to be effective grounds and equal reference levels to the LO signals in lines 172a and 170a and provide mutual isolation of the signals.

Each of the microwave circuits described above is fabricated using standard printed circuit board techniques. A simple off-the-shelf dielectric substrate which is copper clad on both sides is used. The copper is merely etched away to yield the microstrip patterns shown. Though not a constraint, the above noted parameters are significant, particularly the gapwidth and dielectric constant. The disclosed circuit layouts enable microstrip transmission on the substrate as opposed to slot line transmission. While a high dielectric constant substrate may of course be used, the use of a low dielectric constant substrate is enabled by these circuits and is preferred in order to reduce cost.

An alternative application is to transpose the RF and LO inputs such that, referring to FIG. 2, the received signal (RF) is applied to 90 degree hybrid coupler 34 and the high power signal (LO) is applied to input 12. The diode bridge still has both a balanced input (LO) and an unbalanced input (RF). This application may be desirable where an input RF amplifier is used and extremely low conversion loss is not of paramount importance, but rather a broader bandwidth is desired. This application has a higher conversion loss because the image frequency power is returned to load 44.

As noted in my above referenced article "Trace Phase States to Check Mixer Designs", page 52, equation (1):

$$\phi_I = 2\phi_{LO} - \phi_{RF}$$

where $\phi_I$ is the relative phase of the generated image signal, $\phi_{LO}$ is the relative phase of the LO signal, and $\phi_{RF}$ is the relative phase of the RF signal. If minimum conversion loss is desired, then the RF signal is applied to input 12 and the LO signal is applied to 90 degree hybrid 34, FIG. 2. In this application it is seen that, taking zero as a reference phase point, $\phi_{RF}$ through diodes D1 and D2 will be zero and $\phi_{RF}$ through diodes D3 and D4 will also be zero because of their single common connection point 24. Taking the output from hybrid 34 to point 38 as zero and the other output to point 36 as $-90$ degrees, it is seen that $\phi_{LO}$ through diodes D1 and D2 is zero and $\phi_{LO}$ through diodes D3 and D4 is $-90$ degrees. It is thus seen that for diodes D1 and D2, $\phi_I = 2(0°) - 0° = 0°$. For diodes D3 and D4, $\phi_I = 2(-90°) - 0° = -180°$. $\phi_I$ for diodes D1, D2 and for diodes D3, D4 are thus 180 degrees out of phase and cancel when the RF signal is applied to input 12 and the LO signal is applied to input 32.

In the alternative application with the LO signal applied to input 12 and the RF signal applied to 90 degree hybrid coupler 34, $\phi_I$ for diodes D1, D2 and $\phi_I$ for diodes D3, D4 are 90 degrees out of phase with respect to each other and hence do not cancel. Referring to the above equation, $\phi_{LO}$ for diodes D1, D2 is the same as $\phi_{LO}$ for diodes D3, D4 because of single common connection point 24, and zero degrees will be used as a reference point. Assuming the output from hybrid coupler 34 to point 38 is zero degrees and the output from coupler 34 to point 36 is $-90$ degrees, $\phi_{RF}$ for diode pair D1, D2 is zero degrees and $\phi_{RF}$ for diode pair D3, D4 is $-90$ degrees. It is thus seen that for diode pair D1, D2, $\phi_I = 2(0°) - 0° = 0°$. For diode pair D3, D4, $\phi_I = 2(0°) - (90°) = 90°$. It is thus seen that $\phi_I$ for diode pair D1, D2 is 90 degrees out of phase with $\phi_I$ for diode pair D3, D4, and hence do not cancel. This generated image frequency appears on the now RF line 42, which may be terminated.

In another implementation, an up converter is provided by applying input IF and LO signals to generate an output RF signal. This provides conversion from low frequency (IF) to high frequency (RF). In FIG. 1, an IF signal is input to lead 56 or 58, and an LO signal is input to conductor 28. The diode-quad mixer bridge mixes the signals and the heterodyne modulation products generated therefrom include an output RF signal between points 24 and 26 which in turn induces an output RF signal on conductor 12. Up conversion in FIG. 3 is comparable.

DETAILED DESCRIPTION OF THE INVENTION

Figure 5:
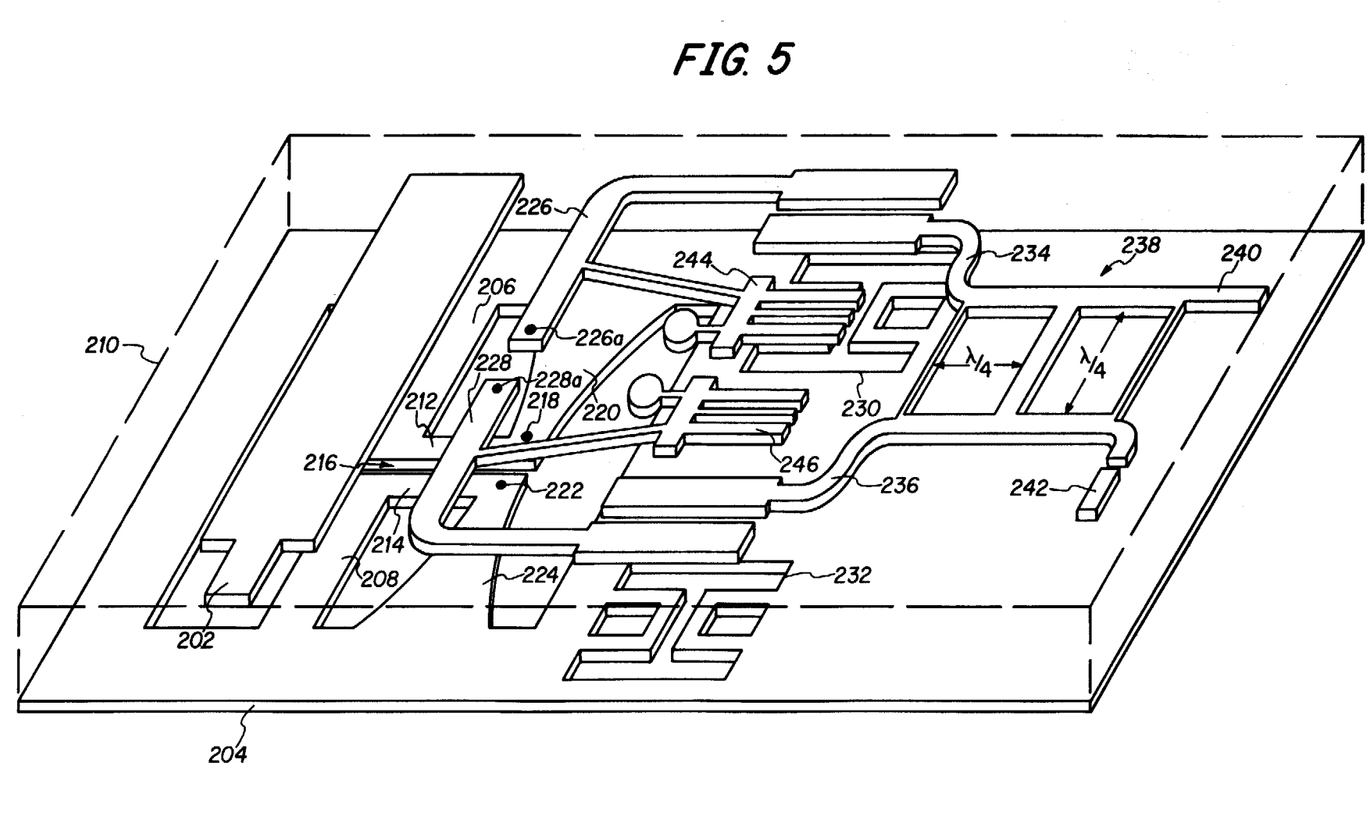
FIG. 5 is a pictorial illustration of the microstrip circuit layout of a converter constructed in accordance with the present invention.

FIG. 5 shows a frequency converter constructed in accordance with the invention, including the cost effective microstrip coupling circuit combination eliminating interdigitated coupler 34 of FIG. 1.

RF transmission line 202 extends above ground plane 204 to couple the RF signal to balanced, coplanar RF conductors 206 and 208. Conductor 202 is spaced from conductors 206 and 208 by a dielectric material substrate 210 of low relative dielectric constant of about 2 to 5. RF conductors 206 and 208 extend from ground plane 204 towards a common area and have extensions 212 and 214 between which the induced RF field exists. The width of gap 216 is about 40 mils. RF conductor point 218 has a wide flared stub 220 extending to the ground plane 204. RF conductor point 222 has a wide flared stub 224 extending to the ground plane 204.

Unbalanced, coplanar LO/IF conductors 226 and 228 are spaced above ground plane 204 by the dielectric substrate 210 and extend towards each other and the common area adjacently above RF conductor points 218 and 222. The ends of LO/IF conductors 226 and 228 are spaced and have diode connection points 226a and 228a for interconnection with RF conductor points 218 and 222, comparably to FIG. 4.

Microstrip LO/IF conductors 226 and 228 each lead to an area juxtaposed a respective balun IF rejection filter 230 and 232 etched on ground plane 204 therebelow for balun coupling therewith. Each balun IF rejection filter 230 and 232 is like filter 30 in FIG. 1, as described in my above noted U.S. Pat. No. 4,240,052. Coplanar, unbalanced microstrip LO conductors 234 and 236 are on top of substrate 210, each leading from the area juxtaposed a respective one of the balun IF rejection filters 230 and 232 for balun coupling therewith. The IF signals generated by the diode mixer bridge on LO/IF conductors 226 and 228 are thus isolated from LO conductors 234 and 236 by balun IF rejection filters 230 and 232.

A microstrip branch line coupler 238, for example as described in George L. Matthaei, et al., "Microwave Filters, Impedance-Matching Networks, and Coupling Structures", New York, McGraw-Hill, 1964, pp. 809–812, is on the top side of substrate 210 and is connected to conductors 234 and 236. This microstrip branch line coupler has quarter wavelength segments, as shown, and yields quadrature microstrip outputs 240 and 242.

A pair of IF bandpass filters 244 and 246 are on the top side of substrate 210 and are connected to LO/IF conductors 226 and 228. These planar filters may be connected to a 90° quadrature hybrid 3 dB coupler, e.g., 54 in FIG. 1. Filters 244 and 246 are like filters 50 and 52 of FIG. 1 and are RF suppression filters rejecting RF signals but allowing IF signals to pass therethrough, an example of which is described in my above noted U.S. Pat. No. 3,678,433.

As can be readily appreciated, the disclosed circuit layout provides microwave circuitry which is particularly cost efficient in manufacture. The microstrip circuitry and coupling combination provided by the invention eliminates the extremely close tolerances and small coupling gaps required by a Lange-type interdigitated coupler. Furthermore, the invention continues the enabled implementation on a low dielectric constant substrate as in FIGS. 1 and 3, further reducing cost compared to the more expensive high dielectric constant substrate material. As above, an alternative application of the invention is to transpose the RF and LO inputs. Also as above, in another implementation of the invention, an up converter is provided by applying input IF and LO signals to generate an output RF signal.

As seen in FIG. 5, the frequency converter of the present invention is provided by: a mixer bridge, for example as shown in FIG. 4, for heterodyne modulation product signal generation; a pair of unbalanced microstrip conductors 226 and 228 leading from the bridge respectively to a pair of balun IF rejection filters 230 and 232; and a second pair of unbalanced microstrip conductors 234 and 236 leading respectively from the pair of balun IF rejection filters 230 and 232 to a microstrip branchline coupler 238. The first pair of microstrip conductors 226 and 228 and the second pair of microstrip conductors 234 and 236 and the microstrip branchline coupler 238 are preferably all coplanar on one side of dielectric substrate 210. The pair of balun IF rejection filters 230 and 232 are preferably etched in ground plane 204 on the other side of dielectric substrate 210. There is further preferably provided a pair of planar IF bandpass filters 244 and 246 connected respectively to the first pair of microstrip conductors 226 and 228 and coplanar therewith.

A first conductor 202 is on one side of substrate 210. Second and third conductors 206 and 208 are on the other side of substrate 210 and extend from ground plane 204 toward a common area and juxtaposed first conductor 202 for interacting therewith to balun couple a field balanced between second and third conductors 206 and 208 across the common area therebetween. Second and third conductors 206 and 208 are etched in ground plane 204. Fourth and fifth conductors 226 and 228 are provided on the substrate. A diode mixer bridge, as shown in FIG. 4, interconnects the second, third, fourth and fifth conductors for heterodyne modulation product signal generation. First and second planar IF rejection filters 230 and 232 are on the substrate juxtaposed respectively the fourth and fifth conductors 226 and 228 for balun coupling therewith. Sixth and seventh conductors 234 and 236 are on the same side of the substrate as the fourth and fifth conductors 226 and 228 and juxtaposed respectively the first and second planar IF rejection filters 230 and 232 for balun coupling therewith. The microstrip branchline coupler 238 is connected to the sixth and seventh conductors 234 and 236. It is preferred that the first conductor 202, the fourth conductor 226, the fifth conductor 228, the sixth conductor 234, and the seventh conductor 236 and the microstrip branchline coupler 238 are all coplanar, and that the ground plane means comprises a planar sheet on the other side of the substrate with the second and third conductors 206 and 208 and the first and second IF rejection filters 230 and 232 etched therein.

Figure 6:
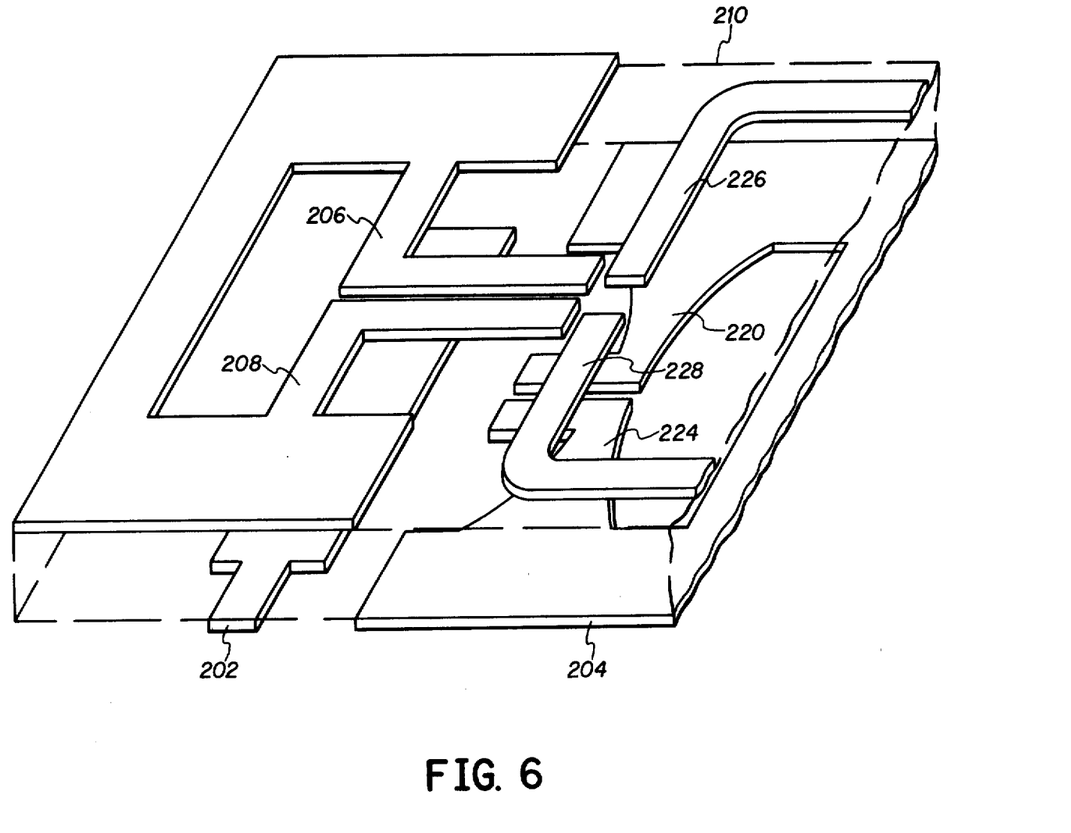
FIG. 6 is a pictorial illustration of an alternative construction of the FIG. 5 implementation of the invention.

In the alternative embodiment of FIG. 6, the ground plane means may comprise a first planar sheet on one side of the substrate and a second planar sheet on the other side of the substrate. The first conductor 202 is on one side of the substrate, coplanar with the first and second IF rejection filters 230 and 232. The second conductor 206 and the third conductor 208 are on the other side of the substrate, coplanar with the fourth conductor 226, the fifth conductor 228, the sixth conductor 234, the seventh conductor 236 and the microstrip branchline coupler 238.

It is recognized that other modifications are possible within the scope of the appended claims.

I claim:

1. A frequency converter comprising in combination:
   a mixer bridge for heterodyne modulation product signal generation,
   a pair of unbalanced microstrip conductors leading from said bridge respectively to a pair of balun IF rejection filters; and
   a second pair of unbalanced microstrip conductors leading respectively from said pair of balun IF rejection filters to a microstrip branch line coupler.

2. The invention according to claim 1 wherein said first and second pairs of microstrip conductors and said microstrip branch line coupler are all coplanar on one side of a dielectric substrate, and wherein said pair of balun IF rejection filters are etched from a ground plane on the other side of said dielectric substrate.

3. The invention according to claim 2 comprising a pair of planar IF bandpass filters connected respectively to said first pair of microstrip conductors and coplanar therewith.

4. A balun coupled frequency converter comprising in combination:
   a dielectric planar substrate;
   a first conductor on one side of said substrate;
   second and third conductors on the other side of said substrate and extending from a ground plane means toward a common area and juxtaposed said first conductor for interacting therewith to balun couple a field balanced between said second and third conductors across said common area;
   fourth and fifth conductors on said substrate;
   a diode mixer bridge interconnecting said second, third, fourth and fifth conductors for heterodyne modulation product signal generation;
   first and second planar IF rejection filters on said substrate juxtaposed respectively said fourth and fifth conductors for balun coupling therewith;
   sixth and seventh conductors on the same side of said substrate as said fourth and fifth conductors and juxtaposed respectively said first and second planar IF rejection filters for balun coupling therewith; and
   microstrip branch line coupler means connected to said sixth and seventh conductors.

5. The invention according to claim 4 wherein said first, fourth, fifth, sixth and seventh conductors and said microstrip branch line coupler means are all coplanar.

6. The invention according to claim 5 comprising first and second planar IF bandpass filters connected respectively to said fourth and fifth conductors and coplanar therewith.

7. The invention according to claim 6 wherein said ground plane means comprises a planar sheet on said other side of said substrate with said second and third conductors and said first and second IF rejection filters etched therein.

8. The invention according to claim 4 wherein:
   said ground plane means comprises a first planar sheet on said one side of said substrate and a second planar sheet on said other side of said substrate;
   said first conductor and said first and second IF rejection filters are coplanar on said one side of said substrate; and
   said second, third, fourth, fifth, sixth and seventh conductors and said microstrip branch line coupler means are coplanar on said other side of said substrate.

9. A balun coupled microwave frequency converter affording economical manufacture in microstrip circuitry, comprising:
   a dielectric substrate;
   a first conductor on said substrate;
   ground plane means on said substrate, said ground plane means having second and third conductors formed therein juxtaposed said first conductor for balun coupling a field balanced between said second and third conductors, said ground plane means further having first and second IF rejection filters formed therein;
   fourth and fifth unbalanced microstrip conductors on said substrate respectively juxtaposed said first and second IF rejection filters for balun coupling therewith;

a mixer bridge interconnecting said second, third, fourth and fifth conductors for heterodyne modulation product signal generation;

sixth and seventh unbalanced microstrip conductors on said substrate respectively juxtaposed said first and second IF rejection filters for balun coupling therewith, such that IF signals generated by said mixer bridge on said fourth conductor are isolated from said sixth conductor by said first IF rejection filter, and such that IF signals generated by said mixer bridge on said fifth conductor are isolated from said seventh conductor by said second IF rejection filter; and microstrip branch line coupler means on said substrate and connected to said sixth and seventh conductors.

10. The invention according to claim 9 wherein:

said ground plane means is a planar sheet on one side of said substrate;

said second and third conductors and said first and second IF rejection filters are coplanar and on said one side of said substrate; and said first, fourth, fifth, sixth and seventh conductors and said branch line coupler means are coplanar and on the other side of said substrate.

11. The invention according to claim 9 wherein:

said ground plane comprises a first planar sheet on one side of said substrate and a second planar sheet on other side of said substrate;

said first conductor and said first and second IF rejection filters are coplanar and on said one side of said substrate;

said second, third, fourth, fifth, sixth and seventh conductors and said branch line coupler means are coplanar and on said other side of said substrate.

12. The invention according to claims 10 or 11 comprising first and second planar IF bandpass filters on the same side of said substrate as said fourth and fifth conductors and respectively connected thereto.

13. A balun coupled microwave frequency converter affording ease of manufacture of a microstrip circuit, comprising;

a dielectric substrate of low dielectric constant substantially less than 9;

an input RF conductor on top of said substrate;

a ground plane on the bottom of said substrate and having second and third RF conductors etched therein to extend from said ground plane toward a common area on the bottom of said substrate juxtaposed said input RF conductor on top of said substrate for interacting therewith to balun couple a field balanced between said second and third RF conductors across said common area, said ground plane further having a pair of balun IF rejection filters etched therein;

fourth and fifth unbalanced microstrip LO/IF conductors on the top of said substrate, each leading to an area juxtaposed a respective one of said balun IF rejection filters for balun coupling therewith;

a diode bridge mixer having two pairs of diodes interconnecting said second, third, fourth and fifth conductors for heterodyne modulation product signal generation;

sixth and seventh unbalanced microstrip LO conductors on the top of said substrate, each leading from an area juxtaposed a respective one of said balun IF rejection filters for balun coupling therewith, such that IF signals generated by said diode mixer bridge on said fourth conductor are isolated from said sixth conductor by the first of said balun IF rejection filters, and such that IF signals generated by said diode mixer bridge on said fifth conductor are isolated from said seventh conductor by the second of said balun IF rejection filters;

microstrip branch line coupler means on the top of said substrate and connected to said sixth and seventh conductors; and a pair of planar IF bandpass filters on the top of said substrate and connected respectively to said fourth and fifth conductors.

14. The invention according to claim 13 affording further cost reduction by enabling implementation on low cost substrate material, wherein:

said dielectric substrate has a low dielectric constant of about 2 to 5.

* * * * *